United States Patent [19]
Williams

[11] Patent Number: 5,898,906
[45] Date of Patent: Apr. 27, 1999

[54] SYSTEM AND METHOD FOR IMPLEMENTING A CELLULAR RADIO TRANSMITTER DEVICE

[75] Inventor: Anthony David Williams, Aptos, Calif.

[73] Assignee: GEC Plessey Semiconductors, Inc., Scotts Valley, Calif.

[21] Appl. No.: 08/738,607

[22] Filed: Oct. 29, 1996

[51] Int. Cl.[6] .................................................. H04B 1/40
[52] U.S. Cl. .............................. 455/75; 455/63; 455/87; 455/119; 455/126; 375/296
[58] Field of Search ................................. 455/75, 76, 84, 455/85, 86, 87, 113, 114, 115, 126, 118, 119, 192.1, 192.2, 182.1, 182.2, 255, 257, 63, 116, 296; 375/295, 296

[56] References Cited

U.S. PATENT DOCUMENTS

| | | | |
|---|---|---|---|
| 4,489,413 | 12/1984 | Richmond et al. | 455/86 |
| 4,654,885 | 3/1987 | Meszko et al. | |
| 4,736,390 | 4/1988 | Ward et al. | |
| 4,783,843 | 11/1988 | Leff et al. | |
| 4,910,800 | 3/1990 | Chung. | |
| 5,020,092 | 5/1991 | Phillips et al. | |
| 5,020,093 | 5/1991 | Pireh. | |
| 5,170,492 | 12/1992 | Moller et al. | |
| 5,170,500 | 12/1992 | Broderick. | |
| 5,175,872 | 12/1992 | Borras. | |
| 5,230,088 | 7/1993 | Kramer, Jr. et al. | 455/76 |
| 5,230,095 | 7/1993 | Onodera et al. | |
| 5,251,053 | 10/1993 | Heidemann. | |
| 5,303,404 | 4/1994 | Kivelä. | |
| 5,469,105 | 11/1995 | Sparks | 455/126 |
| 5,657,344 | 8/1997 | Na | 455/86 |
| 5,732,330 | 3/1998 | Anderson et al. | 455/84 |

FOREIGN PATENT DOCUMENTS 9405078  2/1993  WIPO.

OTHER PUBLICATIONS

V. Petrovic and W. Gosling, Polar–Loop Transmitter, Electronic Letters, May 10, 1979, vol. 15, No. 10, pp. 286–288.

*Primary Examiner*—Reinhard J. Eisenzopf
*Assistant Examiner*—Doris To
*Attorney, Agent, or Firm*—Carr & Ferrell LLP; Gregory J. Koerner

[57] ABSTRACT

A system and method for implementing a cellular radio transmitter device comprises a first oscillator device for generating a first oscillator output signal, a second oscillator device for generating a second oscillator output signal, a power amplifier for amplifying the second oscillator output signal to obtain a transmit signal, a mixer device for combining the first oscillator output signal and the transmit signal to produce a mixer output signal, a phase comparator for comparing the mixer output signal and a transmitter input signal and responsively generating a control signal to control the transmit oscillator, and a feedback path for adding the mixer output signal to the transmitter input signal to compensate for distortion present in the transmit signal.

22 Claims, 8 Drawing Sheets

SYSTEM AND METHOD FOR IMPLEMENTING A CELLULAR RADIO TRANSMITTER DEVICE

BACKGROUND OF THE INVENTION

1. Field of the Invention

This invention relates generally to radio telecommunication systems and more particularly to a system and method for implementing a cellular radio transmitter device.

2. Description of the Background Art

Modern cellular radio telephones provide a portable method of remote communication without the constraint of remaining at a fixed location. This remote communication is accomplished by transmitting radio signals between individual radios each containing a transceiver (a combined receiver and transmitter) which allows a radio user to both speak (transmit) and listen (receive). System performance and system cost are two important factors which significantly impact radio designers, manufacturers and users.

Figure 1:
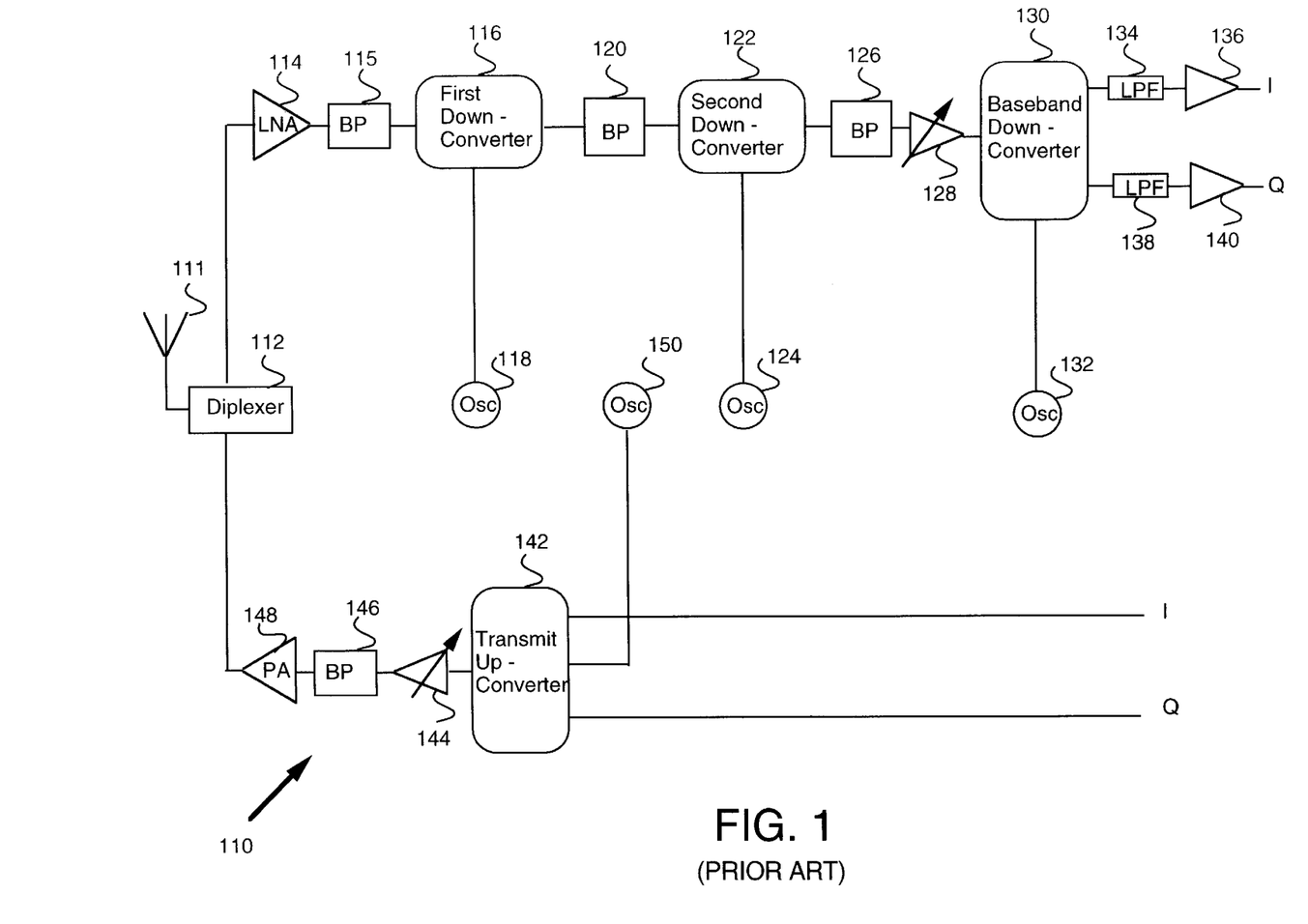
FIG. 1 is a block diagram of a conventional transceiver for receiving and transmitting radio signals.

FIG. 1 is a schematic diagram of a prior art transceiver 110 for receiving and transmitting radio signals using a conventional heterodyning technique. Transceiver 110 uses the heterodyning technique to down-convert the frequency of received radio signals and to up-convert the frequency of transmitted radio signals. Heterodyning is a conventional mixing technique in which two input signals are combined to produce output signals having frequencies equal to both the sum and the difference of the two input signals.

In transmit mode, up-converter 142 heterodynes (combines) the transmit signals (I and Q) and a fixed oscillator 150 output signal to produce a transmit signal at the assigned transmit frequency. The transmit signal is amplified through driver 144 and power amplifier 148 and then broadcast through antenna 111. In receive mode, the frequency of the received radio signal is down-converted in three stages. First down-converter 116 initially heterodynes the received signal with an oscillator 118 output signal to produce a first intermediate frequency signal. Second down-converter 122 then heterodynes the first intermediate frequency signal with an oscillator 124 output signal to produce a second intermediate frequency signal. Finally, baseband down-converter 130 heterodynes the second intermediate frequency signal with an oscillator 132 output signal to produce conventional baseband signals I and Q which are then processed into conventional audio signals.

Figure 2:
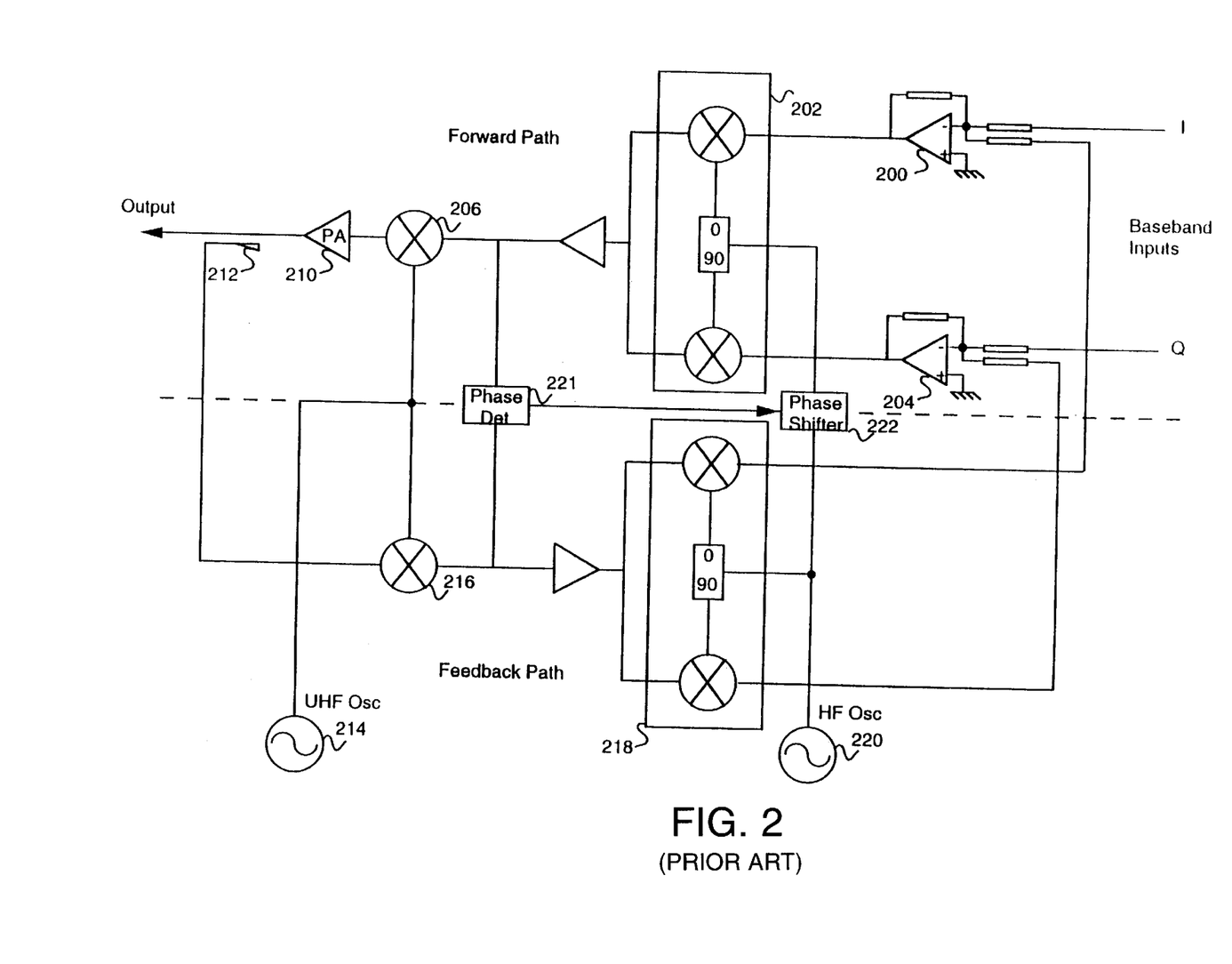
FIG. 2 is a block diagram of a prior art transmitter device which compensates for non-linearity in the transmitter power amplifier stage.

FIG. 2 is a schematic diagram of a prior art transmitter device which compensates for non-linearity in the transmitter power amplifier. Some digital cellular telephone systems make use of angle (phase) modulation techniques in their transmitter sections. In the United States, the Code Division Multiple Access (CDMA) system standard calls for the use of Differential Quaternary Phase Shift Keying (DQPSK) modulation. It is well known that the power amplifier sections of radio transmitters intended for use in these systems must operate in a linear manner in order to faithfully reproduce the carrier amplitude variations that are a characteristic of this modulation scheme.

A well-known method for achieving linear operation of power amplifiers involves running the active devices (transistors or vacuum tubes) at high levels of bias current in order to increase their dynamic range. This method is inappropriate in portable equipment, such as cellular radio telephones, because of the adverse effect on battery life. A method is therefore required whereby a power amplifier design, having good DC to RF efficiency (ie., class AB operation), may be made to exhibit linear gain characteristics within the required operating range.

This problem has been addressed previously using a technique commonly known as "Cartesian Feedback," which has been discussed in *Polar Loop Transmitter*, Petrovic and Gosling, *Electronic Letters*, 1979, 15, (10), pp. 286–288, and which is hereby incorporated by reference. The particular implementation shown in FIG. 2 uses a "feedback phase correction" method as disclosed in International Patent Application No. WO 94/05078, entitled "Apparatus For Compensation Of Phase Rotation In A Final Amplifier," filed on Aug. 2, 1993, by Ericsson, Bergsten and Nystrom, which is hereby also incorporated by reference.

In FIG. 2, baseband I input signal is fed through amplifier 200 to an I mixer in conventional up-converter/phase modulator 202. A baseband Q input signal is likewise fed through amplifier 204 to a Q mixer in up-converter/phase modulator 202. An oscillator 220 output signal is rotated 90 degrees out-of-phase and heterodyned with the Q signal inside the Q mixer. An in-phase oscillator 220 output signal is likewise heterodyned with the I signal inside the I mixer. The outputs of the I and Q mixers in up-converter/modulator 202 are then combined and up-converted again in mixer 206 before being amplified by power amplifier 210 to obtain a transmit signal. Power amplifier 210 is operated in an energy-efficient mode which disadvantageously creates non-linear distortion in the transmit signal.

The FIG. 2 transmitter therefore samples the distorted transmit signal using sampler 212, and down-converts the sampled signal using mixer 216. I and Q error signals are obtained using down-converter/demodulator 218 which essentially reverses the process of up-converter/modulator 202. The I and Q error signals are then fed back into the respective amplifiers 200 and 204 to constitute a negative feedback loop and compensate for the non-linear characteristics of power amplifier 210. Furthermore, to compensate for the timing differences introduced by the propagation delay of the feedback path, phase detector 221 controls phase shifter 222 to advantageously synchronize the I and Q input signals and the I and Q error signals.

However, the FIG. 2 transmitter implementation described above increases the complexity of the transmitter circuitry to such an extent that the technique becomes impractical in portable cellular radio handsets. Therefore, an improved system and method is needed for implementing a cellular radio transmitter device.

SUMMARY OF THE INVENTION

In accordance with the present invention, a system and method are disclosed for implementing a cellular radio transmitter device. In the preferred embodiment of the present invention, a receiver oscillator device generates a receiver oscillator output signal. A transmit oscillator device likewise generates a transmit oscillator output signal. A power amplifier then amplifies the transmit oscillator output signal to obtain a transmit signal for broadcast through a diplexer and an antenna. The transmit signal is also sampled and attenuated with an attenuator device. A mixer device then combines the receiver oscillator output signal and the attenuated transmit signal to produce a mixer output signal.

The transmitter receives one or more baseband transmitter input signals and responsively up-converts and modulates the baseband transmitter input signals using a conventional modulator device to produce a single modulated input signal. In the preferred embodiment, the modulator device is a conventional phase modulator which modulates baseband I and Q signals to obtain the modulated input signal. The modulator device also uses a conversion oscillator which has the same frequency as the mixer output signal described above. A phase comparator then compares the mixer output signal and the modulated input signal and responsively generates a control output signal for controlling the output of the transmit oscillator. The baseband transmitter input signals are thus imposed onto the transmit oscillator according to the present invention.

A demodulator device also accesses the mixer output signal described above and responsively generates one or more feedback error signals which are added, via a feedback path, to the respective baseband transmitter input signals to compensate for any distortion present in the transmit signal generated by the power amplifier. The present invention thus efficiently implements the radio transmitter device to compensate for non-linear operation of the transmitter power amplifier.

DETAILED DESCRIPTION OF THE PREFERRED EMBODIMENT

The invention disclosed herein comprises a system and method for implementing a cellular radio transmitter device and includes a receiver oscillator device for generating a receiver oscillator output signal, a transmit oscillator device for generating a transmit oscillator output signal, a power amplifier for amplifying the transmit oscillator output signal to obtain a transmit signal, a mixer device for combining the receiver oscillator output signal and the transmit signal to produce a mixer output signal, a phase comparator for comparing the mixer output signal and a transmitter input signal and responsively generating a control signal to control the transmit oscillator, and a feedback path for adding the mixer output signal to the transmitter input signal to compensate for distortion present in the transmit signal.

Figure 3:
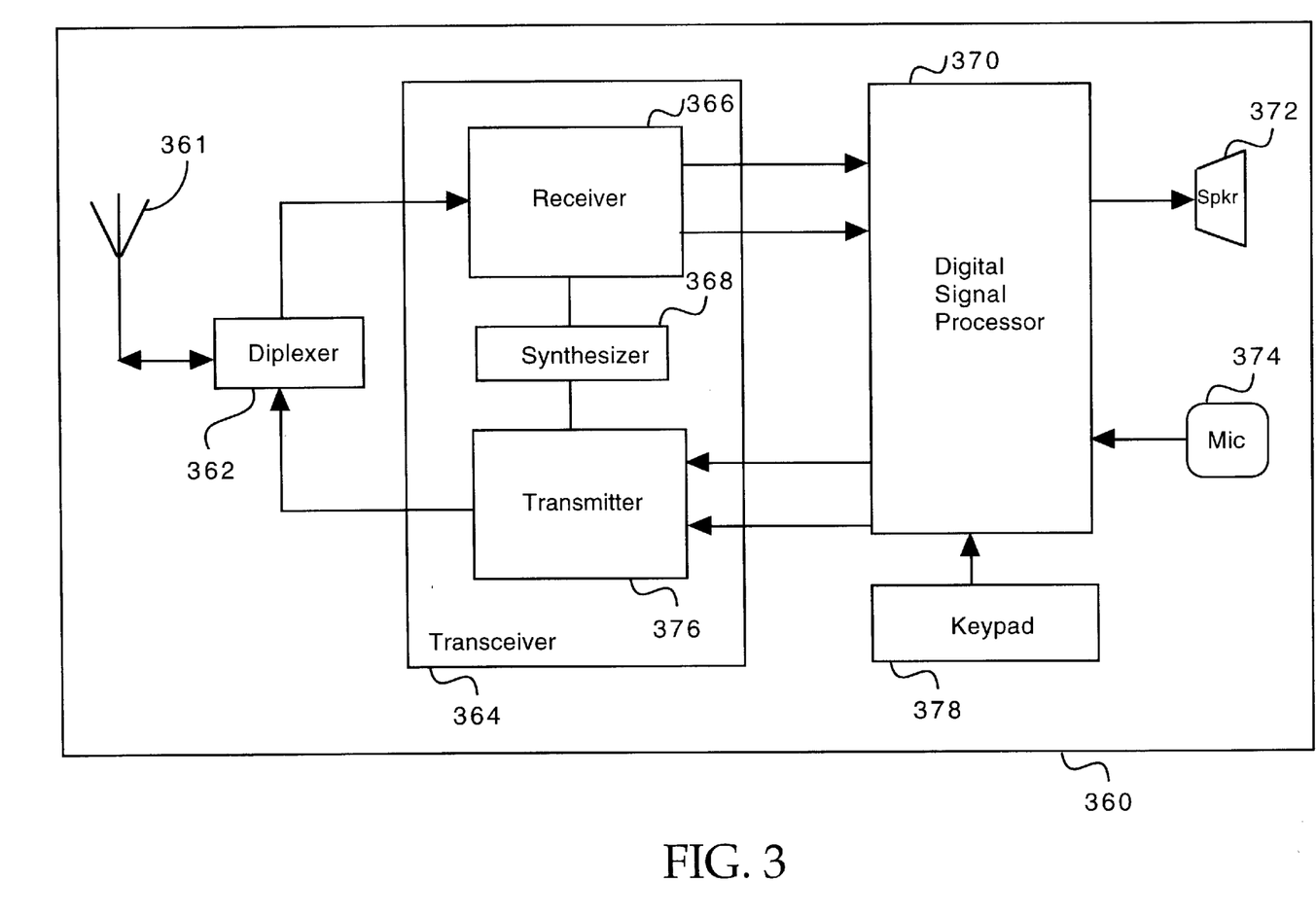
FIG. 3 is a block diagram of a cellular radio telephone according to the present invention.

Referring now to FIG. 3, a block diagram of a cellular radio telephone 360 is shown. Radio telephone 360 functions in several different operational modes including a receive mode and a transmit mode. In transmit mode, a user typically speaks into microphone 374 which converts the sound waves into an electrical transmit signal. Digital signal processor 370 receives the transmit signal and conventionally processes the transmit signal into two channels (I and Q) which are provided to transmitter 376 within transceiver 364. Transmitter 376 conventionally combines the I and Q channels and up-converts the transmit signal frequency to produce a transmit signal at the designated transmit frequency. Transmitter 376 then passes the transmit signal through conventional diplexer 362 and broadcasts the transmit signal using antenna 361.

In receive mode, a radio signal is received by antenna 361 and passed through diplexer 362 to receiver 366 within transceiver 364. Receiver 366 down-converts the receive signal frequency and conventionally divides the receive signal into two channels (I and Q) which are provided to digital signal processor 370. After processing by signal processor 370, the receive signal is typically sent to speaker 372 which converts the receive signal into audible sound waves. Radio telephone 360 preferably includes a keypad 378 which allows a user to interface with radio telephone 360 and perform various control functions (e.g., establishing a communication link with another radio telephone 360).

Figure 4:
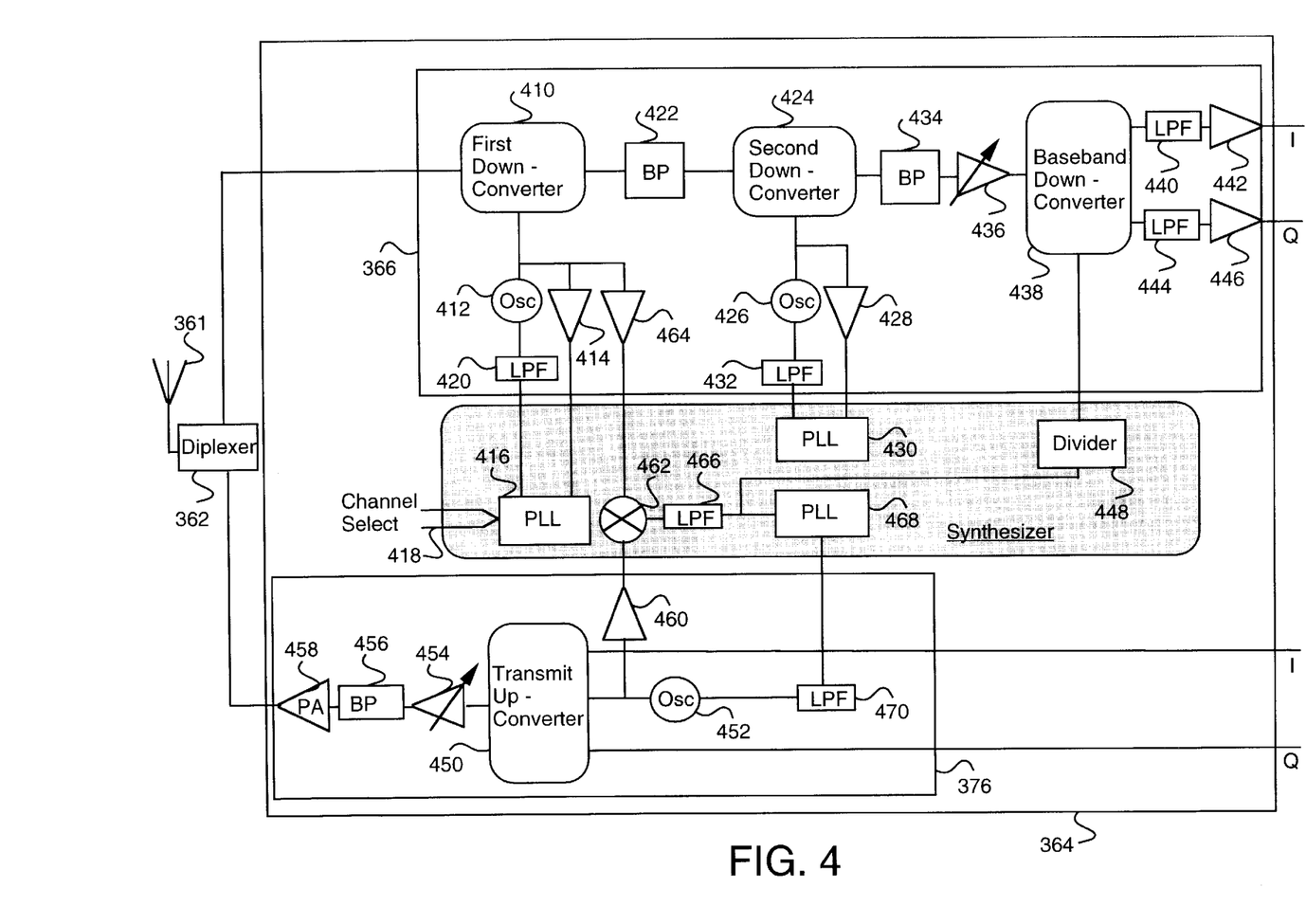
FIG. 4 is a schematic diagram of an embodiment of the transceiver of FIG. 3.

Referring now to FIG. 4, a schematic diagram of an embodiment of transceiver 364 is shown. Transceiver 364 may include receiver 366, transmitter 376 and synthesizer 368. In receiver 366, a radio signal is received by antenna 361 and routed through conventional diplexer 362 to first down-converter 410 which mixes (heterodynes) the received radio signal with an oscillator 412 output signal to produce a first down-converter 410 output signal. Band-pass filter 422 then receives the first down-converter 410 output signal and allows only the heterodyned "difference frequency" to pass, thereby producing a first intermediate frequency (IF) signal which second down-converter 424 receives as an input signal.

Oscillator 412 also feeds the oscillator 412 output signal through amplifier 414 to conventional phase-locked loop (PLL) 416 which responsively generates an oscillator 412 frequency control signal that is passed to oscillator 412 via low-pass filter (LPF) 420 to thereby control the frequency of the oscillator 412 output signal. Similarly, the oscillator 426 output signal is passed through amplifier 428 to PLL 430 which responsively generates an oscillator 426 frequency control signal that is passed to oscillator 426 via low-pass filter 432 to thereby control the frequency of the oscillator 426 output signal. PLL 416 and 430 are further described below in conjunction with FIG. 5.

Second down-converter 424 then mixes (heterodynes) the first intermediate frequency signal (received from band-pass filter 422) and the oscillator 426 output signal to produce a second down-converter 424 output signal. Band-pass filter 434 receives the second down-converter 424 output signal and allows only the heterodyned "difference frequency" to pass, thereby producing a second intermediate frequency signal which is provided, via amplifier 436, to baseband down-converter 438.

Receiver 366 uses a conventional channel-switching technique to receive radio signals on various selectable frequency channels. To change the receiver 366 frequency channel, channel select 418 is used to vary the frequency of the oscillator 412 output signal by controlling the oscillator 412 frequency control signal generated by PLL 416.

Transmitter 376 typically operates on a frequency channel that is separated from the receiver 366 frequency channel by a specified frequency difference. The U.S. and European radio transmission standards specify that the transmitter 376 frequency channel must be 45 megahertz below the receiver 366 frequency channel. To maintain this operational standard, the frequency of the transmit oscillator 452 output signal must therefore track the frequency of the first receive oscillator 412 output signal, so that the transmitter 376 frequency channel maintains the same relationship to the receiver 366 frequency channel when transceiver 364 changes frequency channels using channel select 418.

The present invention permits transmit oscillator 452 to track receive oscillator 412 by using a tracking phase-locked loop technique. Receive oscillator 412 provides the receive oscillator 412 output signal to a first input of mixer 462 via amplifier 464. Similarly, transmit oscillator 452 provides a transmit oscillator 452 output signal to a second input of mixer 462 via amplifier 460. Mixer 462 then combines (heterodynes) the receive oscillator 412 output signal and the transmit oscillator 452 output signal to produce a mixer 462 output signal. Low-pass filter 466 receives the mixer 462 output signal and allows only the heterodyned "difference frequency" to pass, thereby producing a mixer 462 difference signal.

PLL 468 receives the mixer 462 difference signal and responsively generates an oscillator 452 frequency control signal which is provided, via low-pass filter 470, to control the frequency of transmit oscillator 452. Therefore, if receiver 366 changes the frequency of the receive oscillator 412 output signal using channel select 418, then mixer 462 responsively produces a mixer 462 difference signal which is shifted in proportion to the frequency change in the oscillator 412 output signal. PLL 468 receives the shifted mixer 462 difference signal and proportionately shifts the frequency of the transmit oscillator 452 output signal. The transmitter 376 frequency channel may thus track the receiver 366 frequency channel at the frequency differential specified by the radio transmission standards.

Conventional transmit up-converter 456 receives two transmit signals (I and Q) from digital signal processor 370 and mixes (heterodynes) the transmit signals with the oscillator 452 output signal to produce a transmit up-converter 450 output signal. The transmit up-converter 450 output signal is passed through amplifier 454, band-pass filter 456, power amplifier 458, diplexer 362 and is broadcast using antenna 361.

In the preferred embodiment, low-pass filter 466 also provides the mixer 462 difference signal to a divider 448 which effectively divides the frequency of the mixer 462 difference signal by a value "A" to produce a divider 448 output signal. Conventional baseband down-converter 438 then mixes (heterodynes) the second intermediate frequency signal (received from amplifier 436) and the divider 448 output signal to produce two receive signals (I and Q) which are provided to digital signal processor 370 via low-pass filter 440 and amplifier 442 (signal I) or via low-pass filter 444 and amplifier 446 (signal Q).

Figure 5:
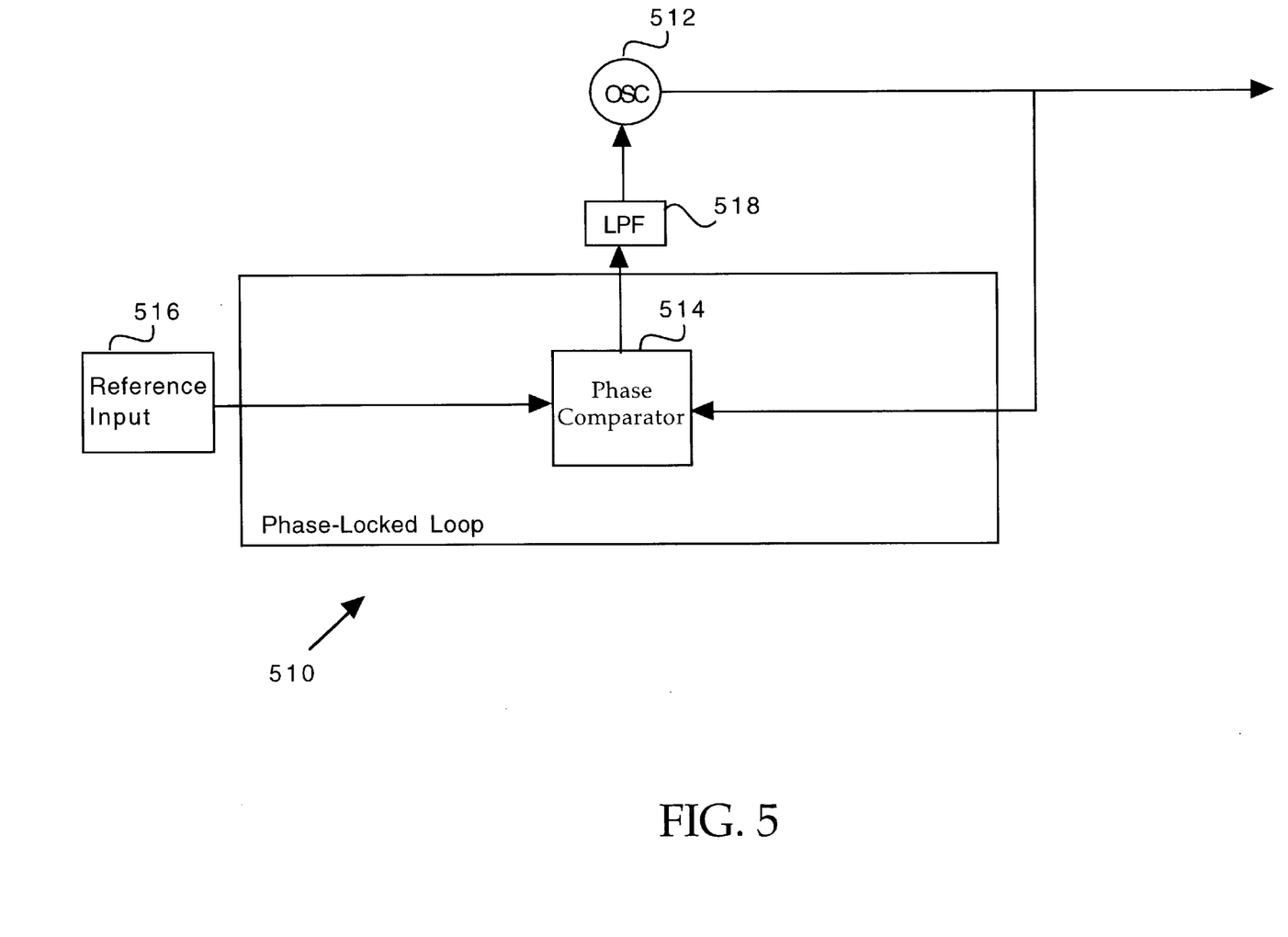
FIG. 5 is a schematic diagram of an embodiment of the phase-locked loop of the present invention.
Figure 6:
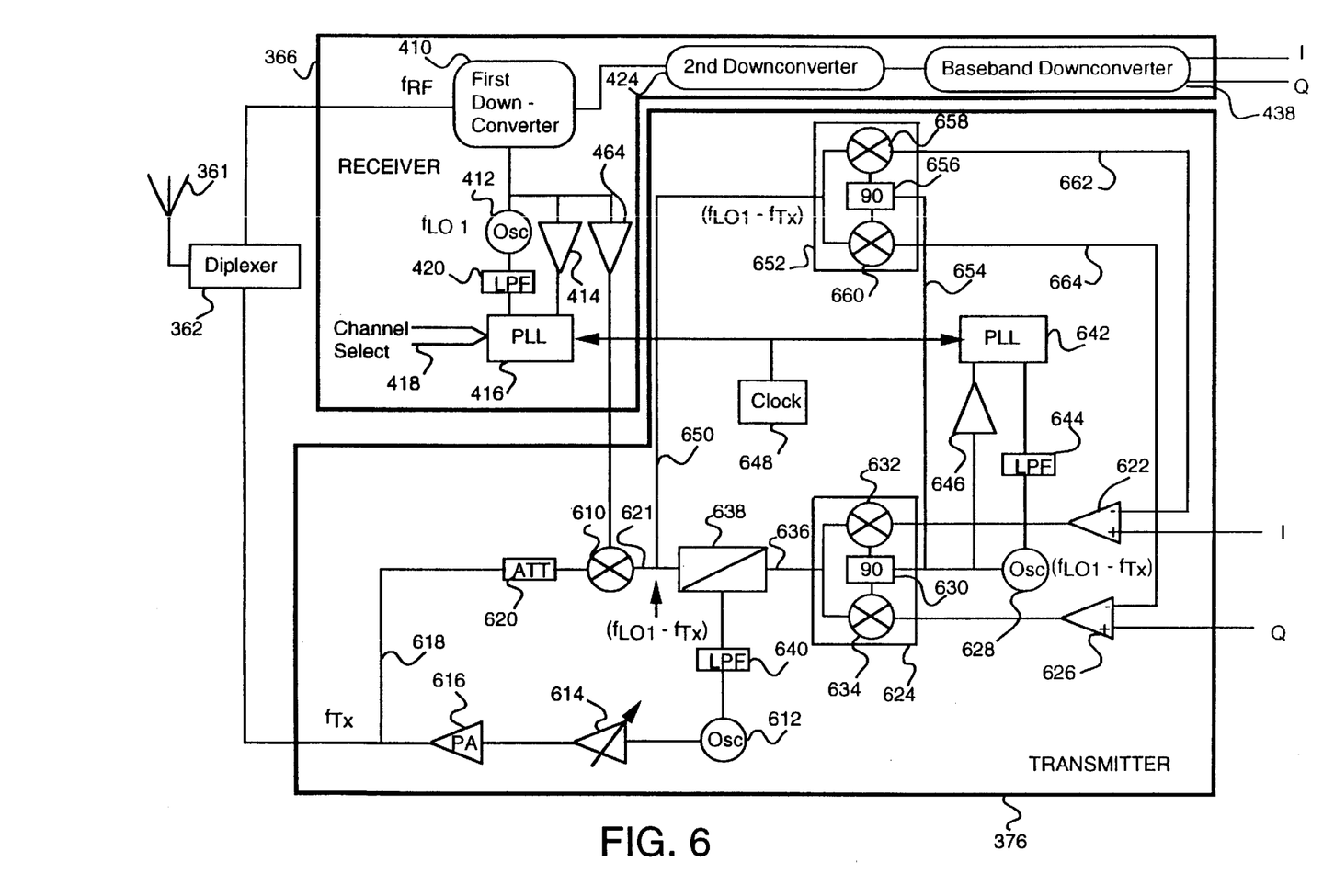
FIG. 6 is a schematic diagram of the preferred embodiment for the transmitter of FIG. 3.

Referring now to FIG. 5, a schematic diagram of an embodiment of a phase-locked loop (PLL) 510 is shown. In the operation of PLL 510, a reference signal received from reference signal input 516 is provided to a first input of phase comparator 514. The reference signal input 516 may receive signals from the output of a crystal oscillator or from the output of various other electronic circuits. Oscillator 512 provides an oscillator 512 output signal to a second input of phase comparator 514. Phase comparator 514 is a conventional device which compares the phase and frequency of any two input signals and responsively generates a corresponding error output signal. The phase comparator 514 error output signal is provided, via low-pass filter 518, to oscillator 512 to effectively control the frequency of the oscillator 512 output signal. In alternate embodiments, various other components may be included in the PLL 510 circuit. For example, additional components may be configured between the output of phase comparator 514 and oscillator 512, or between the output of oscillator 512 and the second input of phase comparator 514. Such additional components may include attenuation devices, amplifiers and mixer devices. Referring now to FIG. 6, a schematic diagram of the preferred embodiment for transmitter 376 is shown. In alternate embodiments, the synthesizer 368 of FIG. 4 may also be incorporated into the FIG. 6 embodiment. In FIG. 6, a first receiver oscillator output signal $f_{LO1}$ is generated by oscillator 412 and provided to a first input of mixer 610 through amplifier 464. The frequency of the first receiver oscillator output signal is controlled by phase-locked loop (PLL) 416.

In transmitter 376, transmit oscillator 612 generates a transmit oscillator output signal which is amplified by driver 614 and by power amplifier 616 to produce a transmit signal $f_{Tx}$. Diplexer 362 then provides the transmit signal to antenna 361 for broadcast. Power amplifier 616 is preferably operated in a mode which exhibits good DC to RF conversion efficiency (i.e., class AB) to conserve battery power within portable radio telephone 360. However, due to this efficient mode of operation, power amplifier 616 typically does not exhibit linear gain characteristics and therefore the present invention must compensate for the non-linear distortion introduced into the transmit signal $f_{Tx}$.

Attenuator 620 samples the transmit signal via line 618 and reduces the transmit signal amplitude to produce an attenuated transmit signal which is then provided to a second input of mixer 610. The attenuated transmit signal (containing non-linear distortion) is combined and heterodyned with the first receiver oscillator output signal $f_{LO1}$ to produce a mixer 610 output signal (on line 621) having a frequency equal to $f_{LO1}-f_{Tx}$. The mixer 610 output signal is then provided via line 621 to a first input of a conventional phase comparator 638.

In the preferred embodiment, transmitter 376 receives I and Q input signals from digital signal processor 370 (FIG. 3). The I input signal is fed to the non-inverting input of amplifier 622 which provides the I signal to an I mixer 632 within conventional up-converter/phase modulator 624. The Q input signal is likewise fed to the non-inverting input of amplifier 626 which provides the Q signal to a Q mixer 634 within up-converter/phase modulator 624.

A conversion oscillator 628 provides a conversion oscillator output signal to phase-shifter 630 within up-converter/phase modulator 624. Phase shifter 630 rotates the conversion oscillator output signal 90 degrees out-of-phase and combines it with the Q input signal within Q mixer 634 to produce a Q mixer output signal. Phase shifter 630 also provides an in-phase conversion oscillator output signal to the I mixer 632 which combines the in-phase conversion oscillator output signal with the I input signal to produce an I mixer output signal. The I mixer output signal and the Q mixer output signals are then combined to produce an up-converter/phase modulator output signal which is provided to a second input of phase comparator 638, via line 636, as a modulated input signal. The frequency of the conversion oscillator 628 output signal is preferably equal to the mixer output signal ($f_{LO1}-f_{Tx}$) that is found on line 621. The frequency of the conversion oscillator 628 output signal is preferably controlled by PLL 642 which is referenced to a clock (crystal reference oscillator) 648 that also serves as a reference for PLL 416.

In the preferred embodiment of FIG. 6, phase comparator 638 then compares the phase of the mixer 610 output signal on line 621 and the phase of the up-converter/phase modulator 624 output signal on line 636. Phase comparator 638 then responsively generates an output control signal which is provided through low-pass filter (LPF) 640 to control the output of transmit oscillator 612. A special phase-locked loop is thus formed by transmit oscillator 612, driver 614, power amplifier 616, attenuator 620 mixer 610 and phase comparator 638. The modulated I and Q input signals received from up-converter/phase modulator 624 are thereby effectively imposed onto transmit oscillator 612 according to the present invention.

The process of passing transmit data through a tracking PLL introduces phase distortion onto the transmit signal $f_{Tx}$. As discussed, above, the non-linear operation of power amplifier 616 also introduces distortion onto the transmit signal $f_{Tx}$. To correct for this distortion in transmit signal $f_{Tx}$, transmitter 376 provides the mixer 610 output signal via line 650 to an I feedback mixer 658 and a Q feedback mixer 660 within conventional down-converter/phase demodulator 652 via line 654. The conversion oscillator 628 provides a conversion oscillator output signal to phase-shifter 656 within down-converter/phase demodulator 652. Phase shifter 656 rotates the conversion oscillator output signal 90 degrees out-of-phase and combines it with the mixer 610 output signal within Q feedback mixer 660 to produce a Q feedback signal. Phase shifter 656 also combines an in-phase conversion oscillator 628 output signal with the mixer 610 output signal within I feedback mixer 658 to produce an I feedback signal. The I feedback signal is then provided to the inverting input of amplifier 622 via line 662 to complete an I channel feedback loop and thereby to compensate for the distortion in transmit signal $f_{Tx}$. The Q feedback signal is likewise provided to the inverting input of amplifier 626 via line 664 to complete a Q channel feedback loop and thereby to compensate for the distortion in transmit signal $f_{Tx}$.

The FIG. 6 element which contributes the most electrical delay to transmitter 376 is the low-pass filter 640 between phase comparator 638 and transmit oscillator 612. This delay, however, is common to both the forward transmit path and the return feedback path, and therefore the need for feedback phase correction is greatly reduced.

Figure 7A:
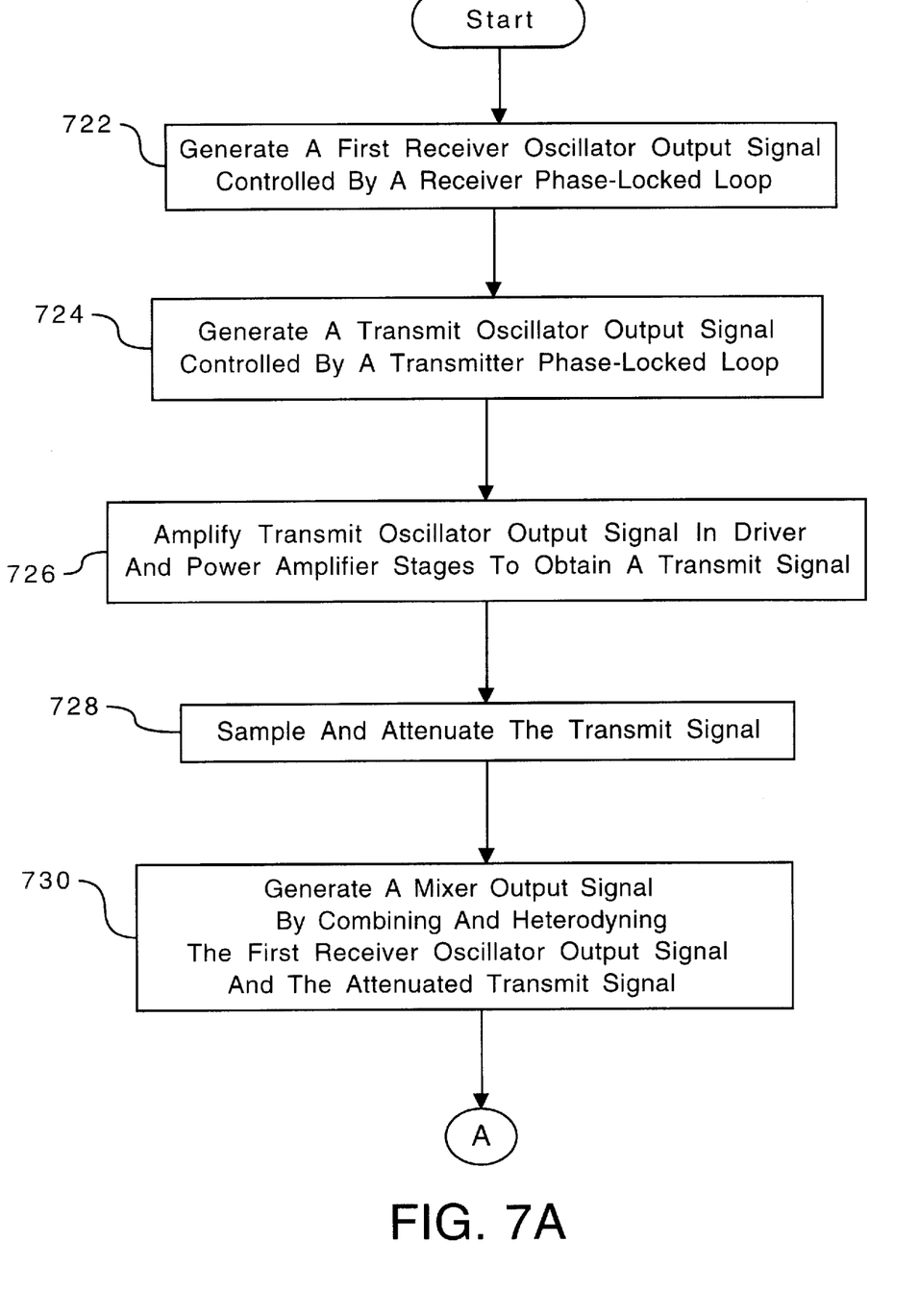
FIG. 7A is the initial portion of a flowchart showing preferred process steps for implementing a cellular radio transmitter device according to the present invention.

Referring now to FIG. 7A, the initial portion of a flowchart showing preferred process steps for implementing a cellular radio transmitter 376 device is shown. Initially, receiver oscillator 412 generates 722 a first receiver oscillator output signal $f_{LO1}$ which has a frequency that is controlled by receiver phase-locked loop 416. Then, transmit oscillator 612 generates 724 a transmit oscillator output signal which is controlled by a transmitter phase-locked loop comprising driver 614, power amplifier 616, attenuator 620, mixer 610, phase comparator 638 and low-pass filter 640.

Next, transmitter 376 amplifies 726 the transmit oscillator 612 output signal using driver 614 and power amplifier 616 to thereby obtain a transmit signal $f_{Tx}$. Attenuator 620 then samples and attenuates 728 the transmit signal, before mixer 610 combines and heterodynes the attenuated transmit signal and the first receiver oscillator 412 output signal to generate 730 a mixer output signal having a frequency equal to $f_{LO1}-f_{Tx}$.

Figure 7B:
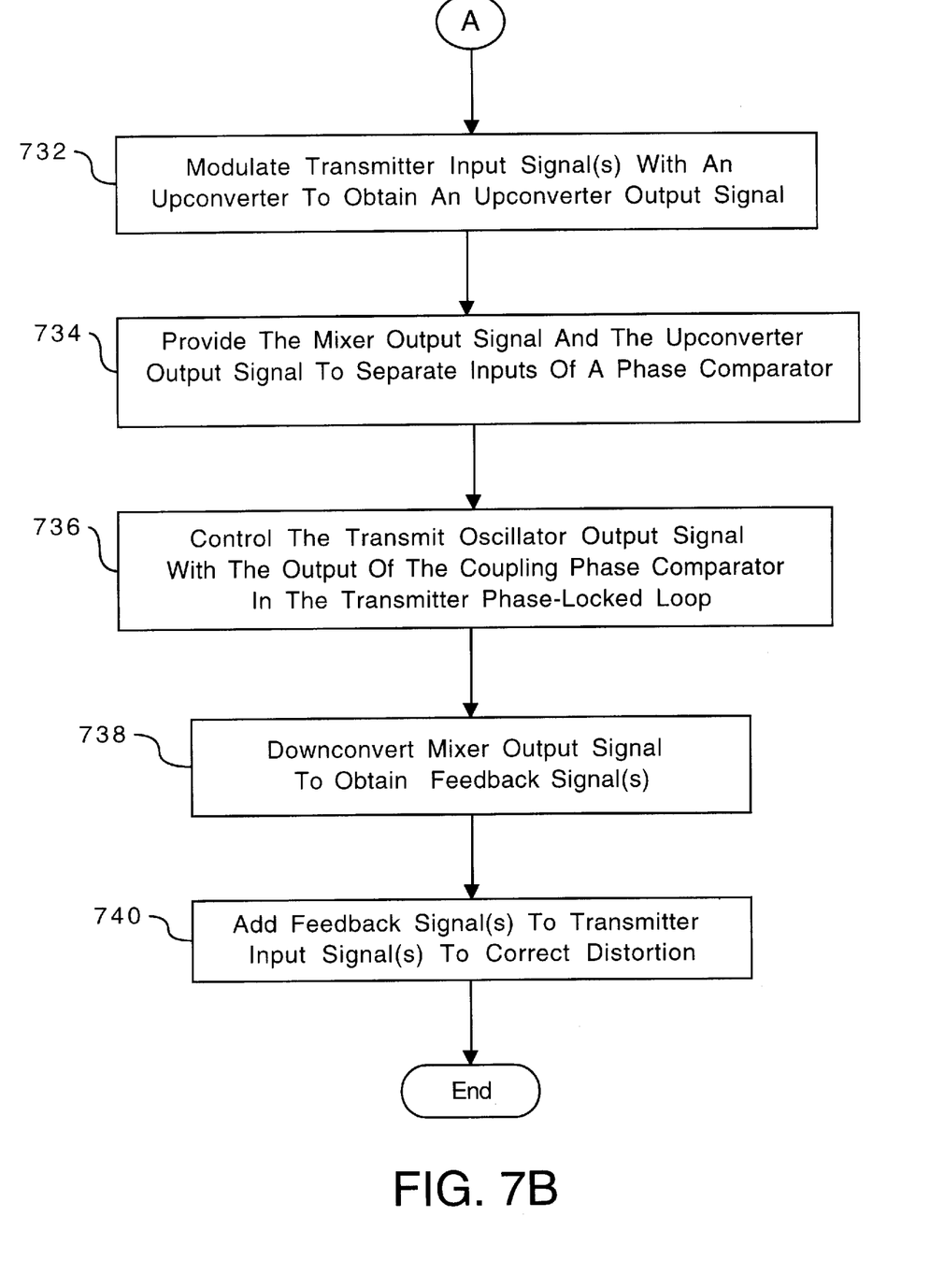
FIG. 7B is the final portion of a flowchart showing preferred process steps for implementing a cellular radio transmitter device according to the present invention.

Referring now to FIG. 7B, the final portion of a flowchart showing preferred process steps for implementing a cellular radio transmitter 376 device is shown. In step 732, up-converter/phase modulator 624 then conventionally modulates transmitter 376 I and Q baseband input signals preferably received from digital signal processor 370 (FIG. 3) to obtain a modulated up-converter 624 output signal.

Transmitter 376 then provides 734 the up-converter output signal and the mixer 610 output signal to separate inputs of conventional phase comparator 638, and then responsively controls 736 the transmit oscillator 612 output signal through the use of the of phase comparator 638 output signal. The transmit I and Q baseband input signals are thus advantageously imposed upon transmit oscillator 612, according to the present invention.

Next, down-converter/phase demodulator 652 samples the mixer 610 output signal via line 650 and conventionally down-converts 738 and demodulates the mixer 610 output signal to produce respective I and Q error feedback signals. Transmitter 376 then adds 740 the I and Q feedback signals to the respective I and Q transmitter input signals to complete the error feedback loop and thereby to compensate for the distortion in the transmit signal $f_{Tx}$. The I error feedback signal is provided on line 662 and summed with the I transmitter input signal in amplifier 622. The Q feedback signal is likewise provided on line 664 and summed with the Q transmitter input signal in amplifier 626.

The invention has been explained above with reference to a preferred embodiment. Other embodiments will be apparent to those skilled in the art in light of this disclosure. For example, the present invention may advantageously be utilized in various selected transmitter devices other than the one illustrated and described above in conjunction with the preferred embodiment, including transmitter devices controlled with software routines executed on computer systems. Further, transmitter 376 may be implemented using various other electrically equivalent embodiments in addition to the one disclosed above as the preferred embodiment. Therefore, these and other variations upon the preferred embodiments are intended to be covered by the present invention, which is limited only by the appended claims.

What is claimed is:

1. A system for implementing a transmitter device, comprising:

a first oscillator device for generating a first oscillator output signal;

a second oscillator device for generating a second oscillator output signal;

a power amplifier for amplifying said second oscillator output signal to obtain a transmit signal;

a mixer device for combining said first oscillator output signal and said transmit signal to produce a mixer output signal;

a phase comparator for comparing said mixer output signal and a transmitter input signal and responsively generating a control signal to control said second oscillator device; and a feedback path for manipulating said mixer output signal to generate a feedback signal, and for adding said feedback signal to said transmitter input signal to compensate for distortion in said transmit signal.

2. The system of claim 1 further comprising an attenuator device for attenuating said transmit signal before said transmit signal reaches said mixer device.

3. The system of claim 1 further comprising a modulator device which modulates said transmitter input signal before said transmitter input signal reaches said phase comparator.

4. The system of claim 3 further comprising a modulator up-converter oscillator, said modulator up-converter oscillator having the same frequency as said mixer output signal.

5. The system of claim 1 wherein said feedback path comprises a demodulator device which receives and demodulates said mixer output signal before adding said mixer output signal to said transmitter input signal.

6. A method for implementing a transmitter device, comprising the steps of:
generating a first oscillator output signal from a first oscillator device;
generating a second oscillator output signal from a second oscillator device;
amplifying said second oscillator output signal with a power amplifier to obtain a transmit signal;
combining said first oscillator output signal and said transmit signal in a mixer device to produce a mixer output signal;
comparing said mixer output signal and a transmitter input signal with a phase comparator to responsively generate a control signal for controlling said second oscillator device;
manipulating said mixer output signal to generate a feedback signal; and
adding said feedback signal to said transmitter input signal via a feedback path to compensate for distortion in said transmit signal.

7. The method of claim 6 further comprising the step of attenuating said transmit signal before said transmit signal reaches said mixer device.

8. The method of claim 6 further comprising the step of modulating said transmitter input signal before said transmitter input signal reaches said phase comparator.

9. The method of claim 8 wherein said step of modulating uses a modulator up-converter oscillator, said modulator up-converter oscillator having the same frequency as said mixer output signal.

10. The method of claim 6 wherein said feedback path comprises a demodulator device which receives and demodulates said mixer output signal before adding said mixer output signal to said transmitter input signal.

11. A computer-readable medium containing instructions for causing a transmitter to perform the steps of:
generating a first oscillator output signal from a first oscillator device;
generating a second oscillator output signal from a second oscillator device;
amplifying said second oscillator output signal with a power amplifier to obtain a transmit signal;
combining said first oscillator output signal and said transmit signal in a mixer device to produce a mixer output signal;
comparing said mixer output signal and a transmitter input signal with a phase comparator to responsively generate a control signal for controlling said second oscillator device;
manipulating said mixer output signal to generate a feedback signal; and
adding said feedback signal to said transmitter input signal via a feedback path to compensate for distortion in said transmit signal.

12. The computer-readable medium of claim 11 further comprising the step of attenuating said transmit signal before said transmit signal reaches said mixer device.

13. The computer-readable medium of claim 11 further comprising the step of modulating said transmitter input signal before said transmitter input signal reaches said phase comparator.

14. The computer-readable medium of claim 13 wherein said step of modulating uses a modulator up-converter oscillator, said modulator up-converter oscillator having the same frequency as said mixer output signal.

15. The computer-readable medium of claim 11 wherein said feedback path comprises a demodulator device which receives and demodulates said mixer output signal before adding said mixer output signal to said transmitter input signal.

16. A system for implementing a transmitter device, comprising:
means for generating a first oscillator output signal from a first oscillator device;
means for generating a second oscillator output signal from a second oscillator device;
means for amplifying said second oscillator output signal with a power amplifier to obtain a transmit signal;
means for combining said first oscillator output signal and said transmit signal in a mixer device to produce a mixer output signal;
means for comparing said mixer output signal and a transmitter input signal with a phase comparator to responsively generate a control signal for controlling said second oscillator device; and
means for providing said mixer output signal to said transmitter input signal via a feedback path to compensate for distortion in said transmit signal.

17. The system of claim 16 further comprising means for attenuating said transmit signal before said transmit signal reaches said mixer device.

18. The system of claim 16 further comprising means for modulating said transmitter input signal before said transmitter input signal reaches said phase comparator.

19. The system of claim 18 wherein said means for modulating uses a modulator up-converter oscillator, said modulator up-converter oscillator having the same frequency as said mixer output signal.

20. The system of claim 16 wherein said feedback path comprises a demodulator device which receives and demodulates said mixer output signal before adding said mixer output signal to said transmitter input signal.

21. A system for implementing a transmitter device, comprising:
a first oscillator device for generating a first oscillator output signal;
a second oscillator device for generating a second oscillator output signal;
a power amplifier for amplifying said second oscillator output signal to obtain a transmit signal; and
a feedback path including,
an attenuator for attenuating said transmit signal to generate an attenuated transmit signal,
a mixer device for combining said first oscillator output signal and said attenuated transmit signal to produce a mixer output signal
a demodulator for manipulating said mixer output signal to generate a feedback signal, and
a summing amplifier for receiving said feedback signal and for summing said feedback signal with a transmitter input signal to compensate for distortion in said transmit signal.

22. The system of claim 21 further comprising a phase comparator for comparing said mixer output signal and said transmitter input signal and responsively generating a control signal to control said second oscillator device.

* * * * *